US006972985B2

(12) United States Patent
Rinerson et al.

(10) Patent No.: US 6,972,985 B2
(45) Date of Patent: Dec. 6, 2005

(54) MEMORY ELEMENT HAVING ISLANDS

(75) Inventors: Darrell Rinerson, Cupertino, CA (US); Christophe J. Chevallier, Palo Alto, CA (US); Philip F. S. Swab, Santa Rosa, CA (US); Steve Kuo-Ren Hsia, San Jose, CA (US); John E. Sanchez, Jr., Palo Alto, CA (US); Steven W. Longcor, Mountain View, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/868,578

(22) Filed: Jun. 15, 2004

(65) Prior Publication Data

US 2005/0243595 A1  Nov. 3, 2005

Related U.S. Application Data

(63) Continuation of application No. PCT/US04/13836, filed on May 3, 2004.

(51) Int. Cl.$^7$ ............................................. G11C 11/00
(52) U.S. Cl. ............ 365/148; 365/230.03; 365/230.06; 365/230.08; 977/DIG. 1
(58) Field of Search .................. 365/145, 230.03, 365/230.06, 230.08

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 6,204,139 B1 | 3/2001 | Liu et al. | |
| 6,225,183 B1 * | 5/2001 | Lee | ............................. 438/384 |
| 6,242,298 B1 * | 6/2001 | Kawakubo | ................... 438/239 |
| 6,473,332 B1 | 10/2002 | Ignatiev et al. | |
| 6,531,371 B2 | 3/2003 | Hsu et al. | |
| 6,753,561 B1 | 6/2004 | Rinerson et al. | |
| 6,833,577 B2 * | 12/2004 | Matsui et al. | ............... 257/300 |
| 6,836,421 B2 | 12/2004 | Rinerson et al. | |
| 6,856,536 B2 | 2/2005 | Rinerson et al. | |
| 6,878,982 B2 * | 4/2005 | Zambrano | ................... 257/306 |
| 2003/0067800 A1 * | 4/2003 | Koganei | ..................... 365/158 |
| 2005/0018516 A1 * | 1/2005 | Chevallier et al. | .......... 365/222 |

OTHER PUBLICATIONS

J.G. Simmons and R.R. Verderber, "New Conduction and Reversible Memory Phenomena in Thin Insulating Films," Proc. Roy. Soc. A., 301 (1967), pp. 77-102.
*Oxides and Oxide Films*, vol. 6, edited by Ashok K. Vijh, Chapter 4 by David Oxley, "Memory Effects in Oxide Films," (Marcel Drekker 1981) pp. 251-325.
Liu et al., "Electric-pulse-induced reversible resistance change effect in magnetoresistive films," Applied Physics Letters, vol. 76, No. 19, May 8, 2000, pp. 2749-2751.

(Continued)

*Primary Examiner*—Hoai Ho
*Assistant Examiner*—Ly Duy Pham
(74) *Attorney, Agent, or Firm*—Morgan Malino

(57) ABSTRACT

A memory including a memory element having islands is provided. The memory has address decoding circuitry and an array of memory plugs. The memory plugs include memory element that have island structures of a first material within the bulk of a second material. The island structures are typically nanoparticles. The memory plugs can be placed in a first resistive state at a first write voltage, placed in a second resistive state at a second write voltage, and have its resistive state determined at a read voltage.

13 Claims, 6 Drawing Sheets

OTHER PUBLICATIONS

A. Beck, J. Bednorz, Ch. Gerber, C. Rossel, and D. Widmer, "Reproducible switching effect in thin oxide films for memory applications," Applied Physics Letters, vol. 77, No. 1, Jul. 3, 2000, pp. 139-141.

Y. Watanabe, J. Bednorz, A. Bietsch, Ch. Gerber, D. Widmer, A. Beck, and S. J. Wind, "Current-driven insulator-conductor transition and nonvolatile memory in chromium-doped $SrTiO_3$ single crystals," Applied Physics Letters, vol. 78, No. 23, Jun. 4, 2001, pp. 3738-3740.

C. Rossel, G.I. Meijer, D. Bremaud, and D. Widmer, "Electric current distribution across a metal-insulator-metal structure during bistable switching," Journal of Applied Physics, vol. 90, No. 6, Sep. 15, 2001, pp. 2892-2898.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

R.E. Thurstans and D. P. Oxley, "The Electroformed metal-insulator-metal structure: A comprehensive model," J. Phys. D. Appl. Phys. 35 (2002), Apr. 2, 2002, pp. 802-809.

L.P. Ma, J. Lui and Y. Yang, "Organic electrical bistable devices and rewritable memory cells," Applied Physics Letters, vol. 80, No. 16, Apr. 22, 2002, 2997-2999.

Liping Ma, Seungmoon Pyo, Jianyong Ouyang, Qianfei Xu, and Yang Yang, "Nonvolatile electrical bistability of organic/metal-nanocluster/organic system," Applied Physics Letters, vol. 82, No. 9, Mar. 3, 2003, 1419-1421.

J. Tour, L. Cheng, D. Nackashi, Y. Yao, A. Flatt, S. St. Angelo, T. Mallouk, and P. Franzon, "NanoCell Electronic Memories," J. Am. Chem. Soc. 2003, vol. 125, No. 43, pp. 13279-13283.

L.D. Bozano, B. W. Kean, V.R. Deline, J.R. Salem and J.C. Scott, "Mechanism for bistability in organic memory elements," Applied Physics Letters, vol. 84, No. 4, Jan. 26, 2004, pp. 607-609.

Liping Ma, Qianfei Xu, and Yang Yang, "Organic nonvolatile memory by controlling the dynamic copper-ion concentration within organic layer," Applied Physics Letters, vol. 84, No. 24, Jun. 14, 2004, pp. 4908-4910.

* cited by examiner

MEMORY ELEMENT HAVING ISLANDS

CROSS-REFERENCE TO RELATED APPLICATIONS

This application is a continuation of PCT Patent Application No. PCT/US04/13836, filed May 3, 2004, hereby incorporated herein by reference in its entirety and for all purposes.

BACKGROUND OF THE INVENTION

1. Field of the Invention

The present invention relates generally to computer memory, and more specifically to non-volatile random access memory.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Since the 1960s, a large body of literature has evolved that describes switching and memory effects in metal-insulator-metal structures with thin insulators. One of the seminal works was "New Conduction and Reversible Memory Phenomena in Thin Insulating Films" by J. G. Simmons and R. R. Verderber in 301 Proc. Roy. Soc. 77–102 (1967), incorporated herein by reference for all purposes. Although the mechanisms described by Simmons and Verderber have since been cast into doubt, their contribution to the field is great.

However, nobody has successfully implemented a metal-insulator-metal structure into a commercial solid-state memory device. In the text "Oxides and Oxide Films," volume 6, edited by A. K. Vijh (Marcel Drekker 1981) 251–325, incorporated herein by reference for all purposes, chapter 4, written by David P. Oxley, is entirely devoted to "Memory Effects in Oxide Films." In that text, Oxley says "It is perhaps saddening to have to record that, even after 10 years of effort, the number of applications for these oxide switches is so limited." He goes on to describe a "need for caution before any application is envisaged. This caution can only be exercised when the physics of the switching action is understood; this, in turn, must await a full knowledge of the transport mechanisms operating in any switch for which a commercial use is envisaged."

In 2002, over twenty years after writing that chapter, Oxley revisited the subject in "The Electroformed metal-insulator-metal structure: A comprehensive model" by R. E. Thurstans and D. P. Oxley 35 J. Phys. D. Appl. Phys. 802–809, incorporated herein by reference for all purposes. In that article, the authors describe a model that identifies the conduction process as "trap-controlled and thermally activated tunneling between metal islands produced in the forming process." "Forming" (or "electroforming") is described as "the localized filamentary movement of metallic anode material through the dielectric, induced by the electric field. Here it is important to note that the evaporated dielectric may contain voids and departures from stoichiometry. When resulting filaments through the dielectric carry sufficient current, they rupture to leave a metal island structure embedded in the dielectric. Electronic conduction is possible through this structure by activating tunneling."

However, the authors caution, "The forming process is complex and inherently variable. Also tunneling barriers are susceptible to changes in their characteristics when exposed to water vapour, organic species and oxygen. . . . Thus, device characteristics can never be expected to be produced consistently or be stable over long periods without passivation, effective encapsulation and a better understanding of the dynamics of the forming process."

In seemingly unrelated research, certain conductive metal oxides (CMOs), have been identified as exhibiting a memory effect after being exposed to an electronic pulse. U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

There are continuing efforts to incorporate solid state memory devices into a commercial non-volatile RAM.

BRIEF DESCRIPTION OF THE DRAWINGS

The invention may best be understood by reference to the following description taken in conjunction with the accompanying drawings, in which.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized.

Figure 1A:
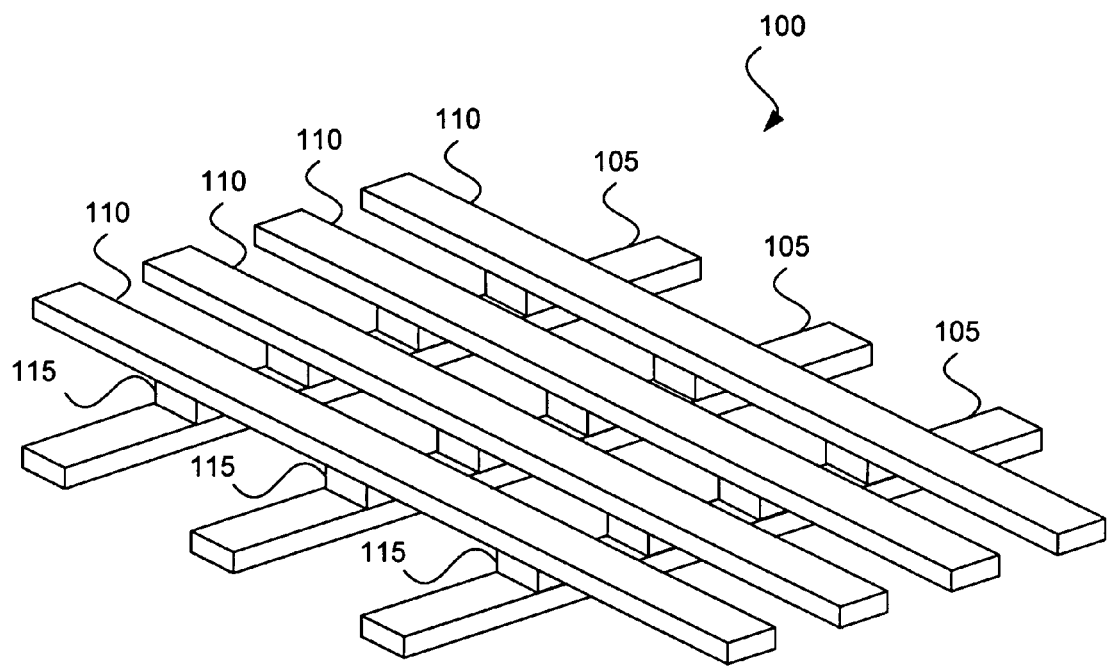
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
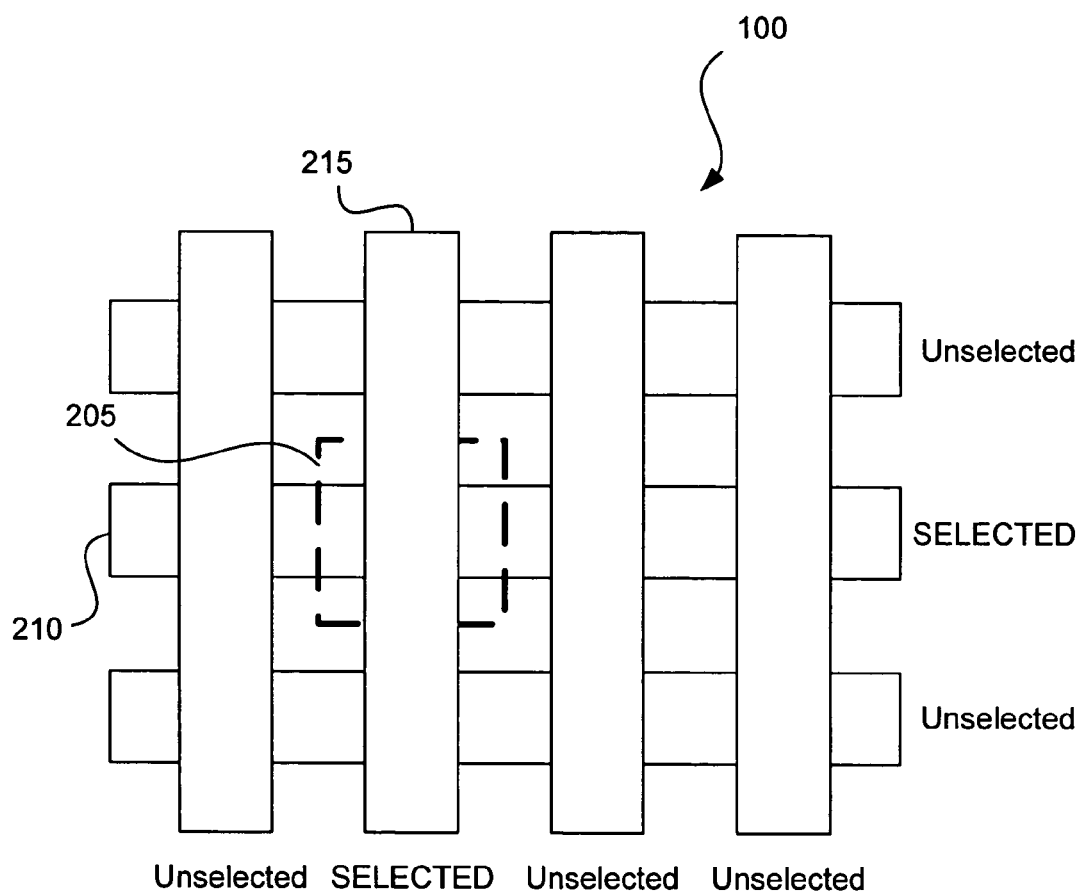
FIG. 2A depicts a plan view of selection of a memory cell in the cross point array depicted in FIG. 1A.
Figure 2B:
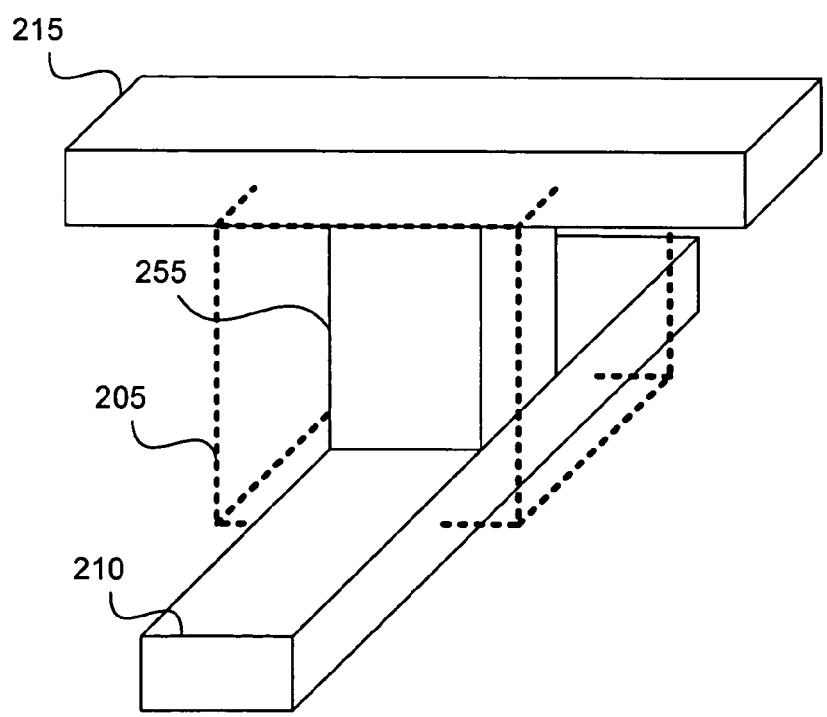
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
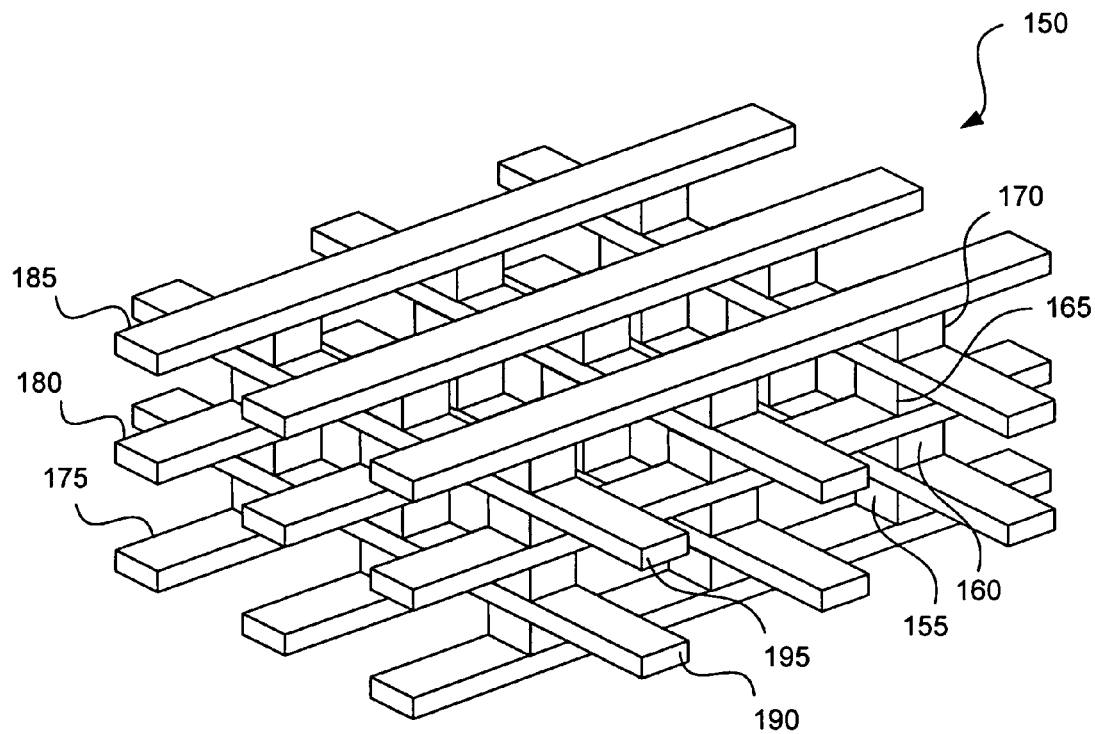
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
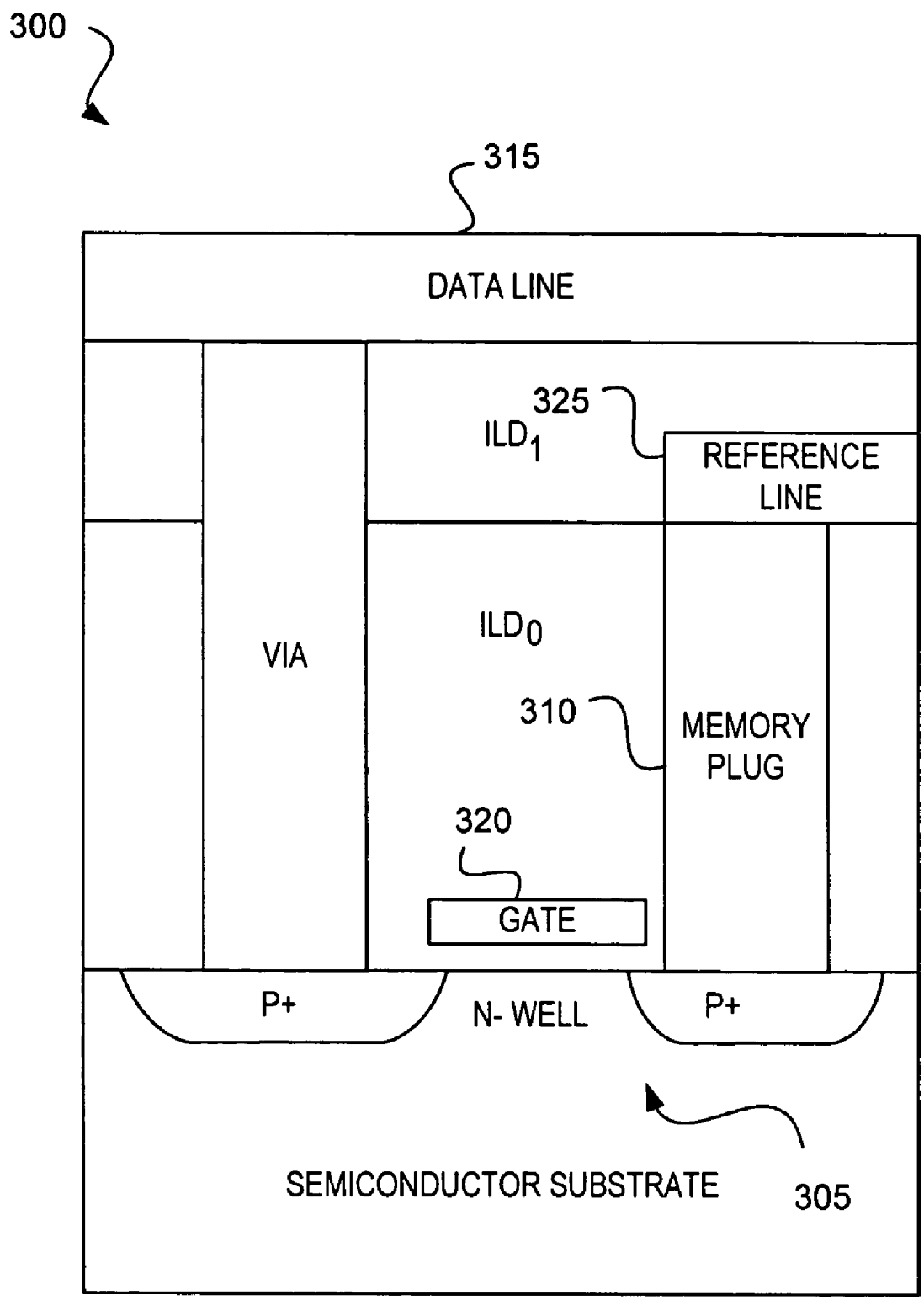
FIG. 3 depicts a generalized representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other.

Memory Chip Configuration

Figure 4A:
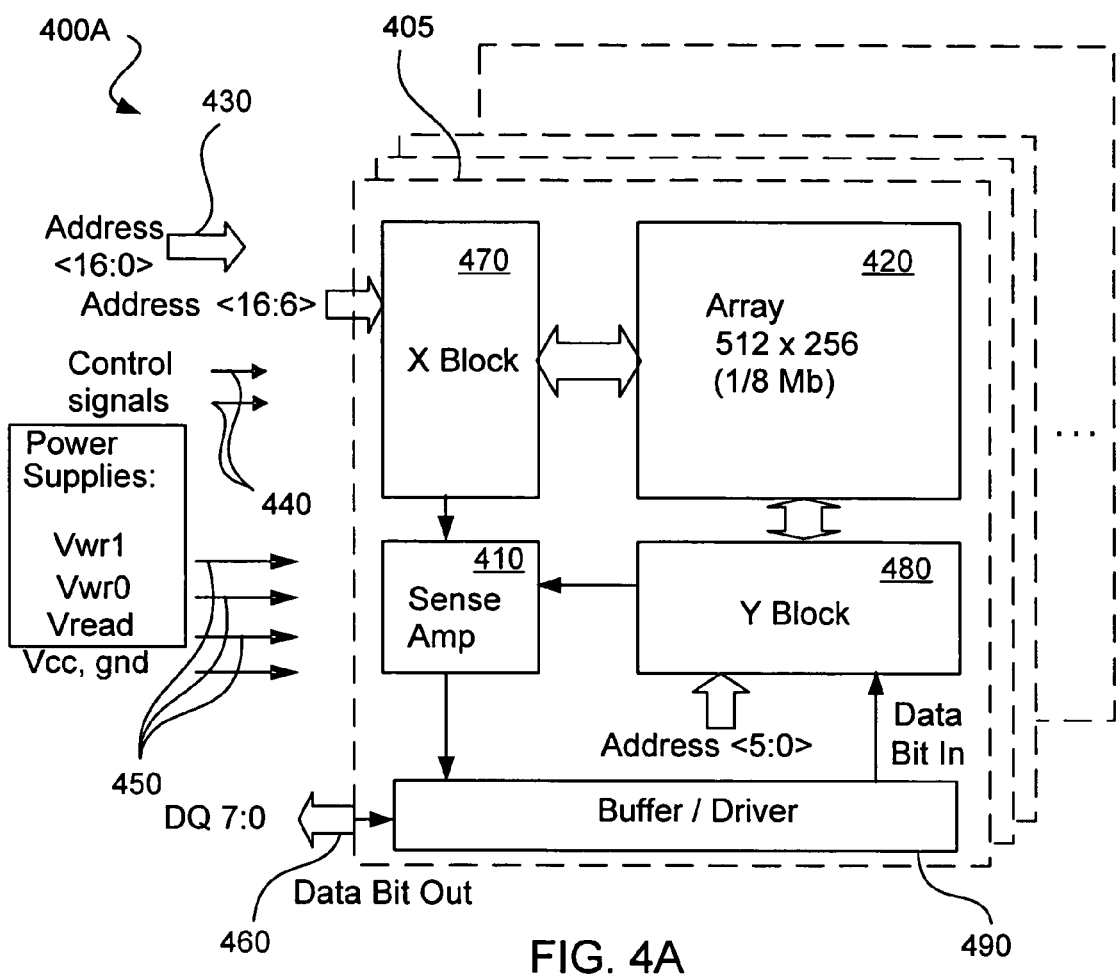
FIG. 4A depicts a block diagram of a representative implementation of an exemplary 1 MB memory.

FIG. 4A is a block diagram of a representative implementation of an exemplary 1 MB memory 400A. Physical layouts might differ, but each memory bit block 405 can be formed on a separate portion of a semiconductor substrate. Input signals into the memory 400A can include an address bus 430, a control bus 440, some power supplies 450, and a data bus 460. The control bus 440 typically includes signals to select the chip, to signal whether a read or write operation should be performed, and to enable the output buffers when the chip is in read mode. The address bus 430 specifies which location in the memory array is accessed—some addresses going to the X block 470 (typically including a predecoder and an X-decoder) to select one line out of the horizontal array lines. The other addresses go to a Y block 480 (typically including a predecoder and a Y-decoder) to apply the appropriate voltage on specific vertical lines. Each memory bit block 405 operates on one line of the memory chip data bus 460.

Figure 4B:
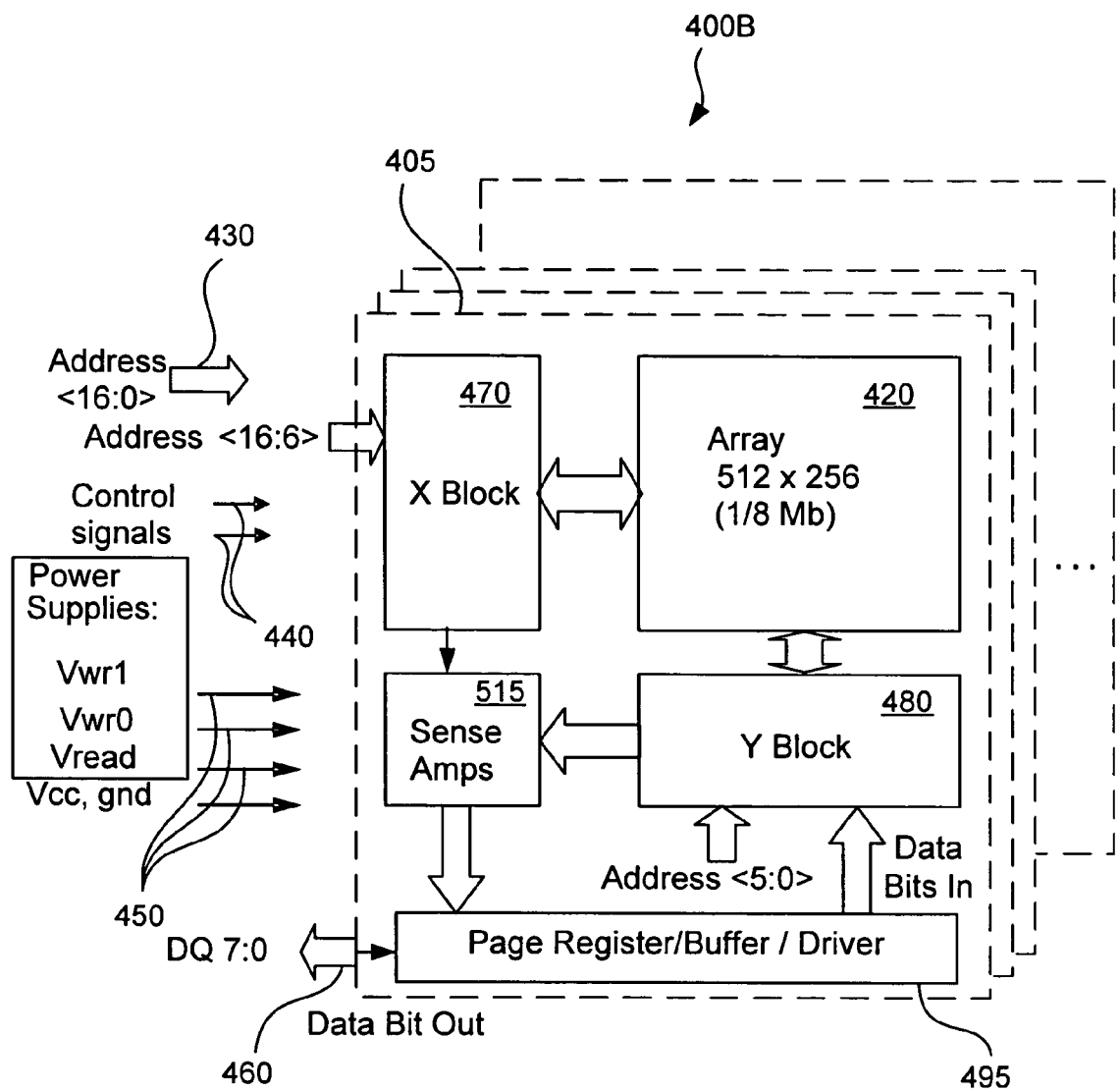
FIG. 4B depicts a block diagram of an exemplary memory that includes sensing circuits that are capable of reading multiple bits.

The reading of data from a memory array 420 is relatively straightforward: an x-line is energized, and current is sensed by the sensing circuits 410 on the energized y-lines and converted to bits of information. FIG. 4B is a block diagram of an exemplary memory 400B that includes sensing circuits 415 that are capable of reading multiple bits. The simultaneous reading of multiple bits involves sensing current from multiple y-lines simultaneously.

During a write operation, the data is applied from the data bus 460 to the input buffers and data drivers 490 to the selected vertical lines, or bit lines. Specifically, when binary information is sent to the memory chip 400B, it is stored in latch circuits within the circuits 490. Each y-line can either have an associated driver circuit 490 or a group of y-lines can share a single driver circuit 490 if the non-selected lines in the group are held to a constant voltage that would not cause the unselected memory plugs to experience any change in resistance. The driver circuit then writes the 1 or 0 to the appropriate memory plug during the appropriate cycle. For example, there may be 1024 y-lines in a cross point array, and the page register may include 8 latches, in which case the y-block would decode 1 out of 128 y-lines and connect this selected line to block 490. As described below, certain memory plugs can have multiple stable distinct resistive states. With such multi-level resistance memory plugs, driver circuits could program, for example, states of 00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_w$, the current path would be the memory plug at the intersection of the two conductive array lines that each carried ½ $V_w$. The other memory plugs would exhibit such high resistances from the non-ohmic characteristic that current would not flow through the half-selected plugs.

A non-ohmic device might be used to cause the memory plug to exhibit a non-linear resistive characteristic. Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs, a pair of electrodes sandwiching the memory element. If the only purpose of the electrodes is as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various functions, including: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

Memory Effect

The memory effect is a hysteresis that exhibits a resistive state change upon application of a voltage while allowing non-destructive reads. A non-destructive read means that the read operation has no effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_w$ and a low resistive state $R_1$ upon application of $+V_w$ should be unaffected by a read operation performed at $-V_R$ or $+V_R$. In such materials a write operation is not necessary after a read operation. It should be appreciated that the magnitude of $|-V_R|$ does not necessarily equal the magnitude of $|+V_R|$.

Furthermore, it is possible to have a memory cell that can be switched between resistive states with voltages of the same polarity. For example, in the paper "The Electroformed metal-insulator-metal structure: a comprehensive model," (already incorporated by reference) Thurstans and Oxley describe a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a best value of 10 k$\Omega$ to 100 k$\Omega$. If the $R_1$ state resistance is much less than 10 k$\Omega$, the current consumption will be increased because the cell current is high, and the parasitic resistances will have a larger effect. If the $R_1$ state value is much above 100 k$\Omega$, the RC delays will increase access time. However, workable single state resistive values may also be achieved with resistances as low as 5 k$\Omega$ and as high as 1 M$\Omega$. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000.

Although the memory effect properties of the memory plug appear to be dominated by carrier trapping, other carrier transport mechanisms such as oxygen migration or electrolyte migration may be present. Even within carrier charge trapping, dominant factors can include space-charge limited currents, thermionic emission limited conduction, electrothermal Poole-Frenkel emission, or Fowler-Nordheim quantum tunneling. While the inventors note that experimental data is consistent with memory effects being created primarily by carrier trapping, they do not wish to be bound by any explanation of how a memory effect is created or how any other effect that is described herein functions.

As previously described, forming is one technique that can be used in metal-insulator-metal structures in order to induce a memory effect. However, it is generally not practical to form a structure within a commercial memory product. Therefore, processing techniques are required to either eliminate the need for forming or create conditions that make forming possible in high-volume manufacturing.

Creating the Memory Effect with Islands

Figure 5:
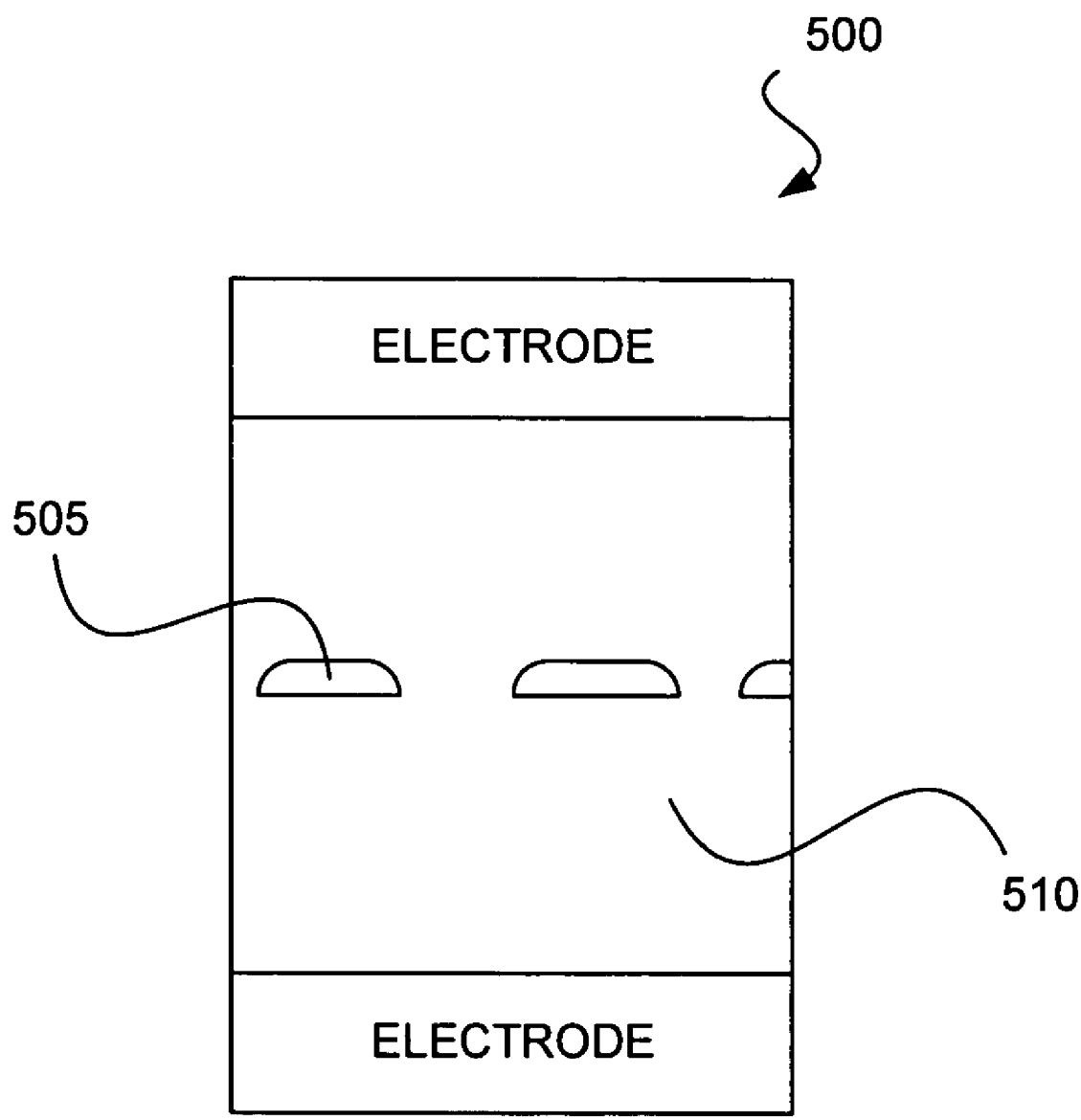
FIG. 5 depicts a block diagram of an exemplary memory plug having islands of one material within the bulk of a second material.

FIG. 5 is a block diagram showing a memory plug 500 having islands of one material 505 within the bulk of a second, less conductive material 510. The islands 505 are one way to synthesize or recreate the effect of forming so that it could be implemented in a commercially manufactured memory product. Islands (as opposed to a continuous thin film) can be formed by a number of different processes, including sputtering, co-sputtering, evaporation, molecular beam epitaxy, atomic layer deposition, implantation, etc, and are typically related to the surface energies of the two materials. Those skilled in the art will appreciate that a first material can form islands on the surface of a second material under some processes and not others.

The density of the islands will typically be less than the percolation threshold (the point at which a continuous path of nearest neighbors could be formed from one side to another). Once the percolation threshold is reached, the layer becomes more like a thin film and less like an island structure. The size of the islands will typically be nano-structures, between 0.5 and 50 nanometers thick.

In one specific embodiment, a portion of a semiconductive material is first deposited on an electrode. Then, conductive islands are formed on the semiconductive material. After the islands are formed, another portion of the same semiconductive material is deposited on the islands. Then, either a top electrode is formed or additional island/semiconductive material layers are formed prior to the top electrode. Although forming is typically associated with insulators within an MIM structure, semiconductors are generally preferable in a memory plug because the low resistive state allows a faster access time. However, those skilled in the art will also appreciate that very thin insulators can be conductive due to charge tunneling and certain types of insulators, when placed in contact with certain electrodes, will have an appropriate work function at the electrode/insulator interface that allows charge injection.

Elemental semiconductors include antimony, arsenic, boron, carbon, germanium, selenium, silicon, sulfur, and tellurium. Compound semiconductors include gallium arsenide, indium antimonide, and the oxides of most metals. Additionally, some perovskites also exhibit semiconductive properties.

Perovskites typically include two or more metals, the metals being selected from the group consisting of transition metals, alkaline earth metals and rare earth metals. The perovskites (generally in the form of $ABX_3$ structures, where A has an atomic size of 1.0–1.4 Å and B has an atomic size of 0.45–0.75 Å for the case where X is either oxygen or fluorine) can be any number of compositions, including manganites (e.g., $Pr_{0.7}Ca_{0.3}MnO_3$, $Pr_{0.5}Ca_{0.5}MnO_3$ and other PCMOs, LCMOs using lanthanum and calcium as A, etc.), titanates (e.g., $SrTiO_3$ doped with Nb, also identified as STO:Nb), and zirconates (e.g., $SrZrO_3$ doped with Nb, also identified as SZO:Nb). Specifically, $MnO_3$, when combined with the rare earth metals La, Pr or some combination thereof and the alkaline earth metals Ca, Sr or some combination thereof have been found to be particularly effective for use in the memory plug.

Conductive metal islands can then be formed by depositing any number of different materials on the surface of the perovskite. A reactive metal, for example, will create a strong memory effect. Whether a metal is a reactive metal is determined by its relation to the perovskite, and whether the metal is a strong enough reducing agent to reduce the semiconductive metal oxide and be oxidized. For example, Al will reduce a PCMO perovskite. Other reactive metals, depending on the semiconductive metal oxide, can include Ta, Ti, Zr, Y, Hf, Cr and Mg. In such a case, the resulting reactive metal itself may not be creating the semiconductive metal islands (for example, $AlO_2$ may be more insulating than the PCMO perovskite, but the remaining elements of Pr, Ca and Mn may themselves form a conductive island). While this is one possible explanation of the reaction that occurs within the various materials, the inventors do not wish to be bound by any explanation of how conductive islands are formed when a reactive metal is deposited on a semiconductive metal oxide.

Another possible explanation is that the conductive islands are surrounded by an insulating envelope. If such a reaction were occurring in the above example, then the islands would consist of conductive Al cores surrounded by an insulating skin of $AlO_2$, embedded within the semiconductive PCMO perovskite.

Alternatively, a memory effect can be created with a non-reactive metal, such as gold, silver or platinum. The non-reactive metal would not react with the underlying perovskite, but instead (depending on surface energies) simply preferentially nucleate into an array of conductive island structures. Although such non-reactive metals may not create as strong a memory effect, stronger memory effects can be created by either increasing the size of the islands or creating multiple layers of islands.

In another specific example, a damascene process could be employed where an interlayer dielectric such as $SiO_2$ is patterned in order to create voids over the bottom electrodes. Aluminum oxide can then be deposited and polished off the $SiO_2$ surface such that a portion of the void is filled with aluminum oxide. A small amount of conductive metal or oxide could then be formed on top of the aluminum oxide, which will preferentially nucleate into an array of island formations on the aluminum oxide. Another layer of aluminum oxide could then be sputtered to fill more the void, followed by another polish and then another deposition of islands. A final layer of aluminum oxide could then be deposited to completely fill the void, followed by a final polish so that the $SiO_2$/aluminum oxide surface was smooth.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. For example, instead of limiting how much reactive metal is deposited on top of the multi-resistive state element, any excess unreacted material can simply be polished off with CMP. Accordingly, that which is intended to be protected by Letters Patent is set forth in the claims and includes all variations and modifications that fall within the spirit and scope of the claim.

What is claimed is:

1. A memory comprising:
   address lines operable to carry addresses;
   control lines operable to carry control signals;
   data lines operable to carry data;
   array lines;
   an address decoder that decodes the address on the address lines and activates certain array lines;
   drivers that, as a function of the control signals, can cause some array lines to be placed at a first write voltage, a second write voltage, or a read voltage;
   two-terminal memory plugs, each two-terminal memory plug electrically connected to at least one array line, the two-terminal memory plug being able to be reversibly written to a first resistive state when the some array lines are at the first write voltage, reversibly written to a second resistive state when the some array lines are at the second write voltage, and have its resistive state undisturbed when the some array lines are at the read voltage;
   wherein the two-terminal memory plugs include memory elements that have island structures of a first material within the bulk of a second material.

2. The memory of claim 1, wherein the first material is more conductive than the second material.

3. The memory of claim 2, wherein second material is a semiconductor.

4. The memory of claim 3, wherein the second material is a perovskite.

5. The memory of claim 4, wherein the first material is formed through deposition of a reactive metal in middle of the perovskite.

6. The memory of claim 2, wherein the first material is a non-reactive metal.

7. The memory of claim 2, wherein the first material is separated from the bulk of the second material by an insulating envelope.

8. The memory of claim 1, wherein the two-terminal memory plug includes electrodes at each terminal.

9. The memory of claim 8, wherein the electrodes are formed in parallel planes and the islands are formed in a plane that is parallel the planes of the electrodes.

10. The memory of claim 1, wherein the islands are between 0.5 and 50 nanometers thick.

11. The memory of claim 1, wherein a transistor is interposed between each of the two-terminal memory plugs and the at least one array line that it is electrically connected to.

12. The memory of claim 1, wherein each of the two-terminal memory plug is in electrical contact with exactly two array lines such that each terminal is connected to one array line.

13. A memory comprising:
    address lines;
    address decoding circuitry in communication with the address lines; and
    addressable two-terminal memory plugs that are activated by the address decoding circuitry, each two-terminal memory plug including
      a pair of electrodes, each electrode defining a terminal; and
      nanoparticles of a first material embedded within the bulk of a second material,
    the bulk of the second material being in electrical communication with the electrodes;
    wherein, when the addressable two-terminal memory plug is activated, the addressable two-terminal memory plug can be reversibly written to a first resistive state at a fist write voltage, reversibly written to a second resistive state at a second write voltage, and have its resistive state determined at a read voltage.

* * * * *